(12) United States Patent
Jung

(10) Patent No.: US 8,436,383 B2
(45) Date of Patent: May 7, 2013

(54) LIGHT EMITTING DEVICE, LIGHT EMITTING DEVICE PACKAGE, AND LIGHTING SYSTEM

(75) Inventor: Han Wook Jung, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/027,644

(22) Filed: Feb. 15, 2011

(65) Prior Publication Data

US 2011/0198648 A1 Aug. 18, 2011

(30) Foreign Application Priority Data

Feb. 17, 2010 (KR) .................. 10-2010-0014060

(51) Int. Cl.
*H01L 33/00* (2010.01)

(52) U.S. Cl.
USPC ......... 257/98; 257/99; 257/103; 257/E33.067

(58) Field of Classification Search .................. None
See application file for complete search history.

(56) References Cited

U.S. PATENT DOCUMENTS

| | | | |
|---|---|---|---|
| 2005/0029536 A1 | 2/2005 | Sugitatsu et al. | 257/103 |
| 2006/0234408 A1 | 10/2006 | Lee et al. | 438/22 |
| 2007/0126013 A1 | 6/2007 | Kim et al. | 257/91 |
| 2008/0017874 A1* | 1/2008 | Erchak et al. | 257/94 |
| 2009/0262775 A1* | 10/2009 | Uchida et al. | 372/50.124 |
| 2010/0012969 A1 | 1/2010 | Yoon et al. | 257/99 |
| 2010/0093123 A1 | 4/2010 | Cho et al. | 438/42 |
| 2010/0103972 A1* | 4/2010 | Saito et al. | 372/50.1 |
| 2010/0172390 A1* | 7/2010 | Matsubara et al. | 372/50.12 |

FOREIGN PATENT DOCUMENTS

| | | |
|---|---|---|
| JP | 2005-045162 A | 2/2005 |
| JP | 2006165309 A * | 6/2006 |
| JP | 2007-129028 A | 5/2007 |
| JP | 2007-200929 A | 8/2007 |
| JP | 2008-047638 A * | 2/2008 |
| KR | 10-2005-0049066 A | 5/2005 |
| KR | 10-2006-0104162 A | 10/2006 |
| KR | 10-0638730 B1 | 10/2006 |
| KR | 10-0668964 | 1/2007 |
| KR | 10-0683924 | 2/2007 |
| KR | 10-2008-0065326 A | 7/2008 |
| KR | 10-0871614 | 11/2008 |
| KR | 10-2009-0071088 A | 7/2009 |
| WO | WO-2008/117562 A1 * | 10/2008 |

OTHER PUBLICATIONS

Translation from the Japan Patent Office website http://dossier1.ipdl.inpit.go.jp/AIPN/odse_top_dn.ipdl?N0000=7400 of Matsubara et al (JP-2006165309-A), Jun. 2006.*
Korean Office Action dated Jun. 18, 2010 issued in Application No. 10-2010-0014060 (with translation).
Korean Decision to Grant a Patent dated Oct. 4, 2010 issued in Application No. 10-2010-0014060 (with translation).

* cited by examiner

*Primary Examiner* — Johannes P Mondt
(74) *Attorney, Agent, or Firm* — KED & Associates, LLP

(57) ABSTRACT

Disclosed are a light emitting device and a light emitting device package. The light emitting device includes a first conductive type semiconductor layer including P-type dopants and having a plurality of holes, an electrode connected to the first conductive type semiconductor layer, an active layer under the first conductive type semiconductor layer, a second conductive type semiconductor layer under the active layer, and an electrode layer under the second conductive type semiconductor layer.

13 Claims, 16 Drawing Sheets

LIGHT EMITTING DEVICE, LIGHT EMITTING DEVICE PACKAGE, AND LIGHTING SYSTEM

The present application claims priority under 35 U.S.C. §119(a) of Korean Patent Application No. 10-2010-0014060 filed on Feb. 17, 2010, which is hereby incorporated by reference in its entirety.

BACKGROUND

The embodiment relates to a light emitting device and a light emitting device package having the same.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_xAl_yGa_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and a lighting device.

SUMMARY

The embodiment provides a light emitting device having a new structure and a light emitting device package having the same.

The embodiment provides a light emitting device and a light emitting device package having the same, capable of protecting a semiconductor structure by removing a growth substrate.

According to the embodiment, the light emitting device includes, a first conductive type semiconductor layer including P-type dopants and having a plurality of holes, an electrode connected to the first conductive type semiconductor layer, an active layer under the first conductive type semiconductor layer, a second conductive type semiconductor layer under the active layer, and an electrode layer under the second conductive type semiconductor layer.

According to the embodiment, the light emitting device includes, an electrode layer, a first conductive type semiconductor layer including P-type dopants on the electrode layer, a plurality of holes disposed in the first conductive type semiconductor layer, an insulating material in the hole, an active layer on the first conductive type semiconductor layer, a second conductive type semiconductor layer on the active layer and an electrode on the second conductive type semiconductor layer.

According to the embodiment, the light emitting device package includes, a body, a plurality of lead electrodes on the body, a light emitting device provided at least one lead electrode of the lead electrodes, and electrically connected to the lead electrodes, and a molding member used to mold the light emitting device. The light emitting device includes a first conductive type semiconductor layer including P-type dopants and having a plurality of holes therein, an electrode connected to the first conductive type semiconductor layer, an active layer under the first conductive type semiconductor layer, a second conductive type semiconductor layer under the active layer, and an electrode layer under the second conductive type semiconductor layer.

DETAILED DESCRIPTION OF THE EMBODIMENTS

Figure 1:
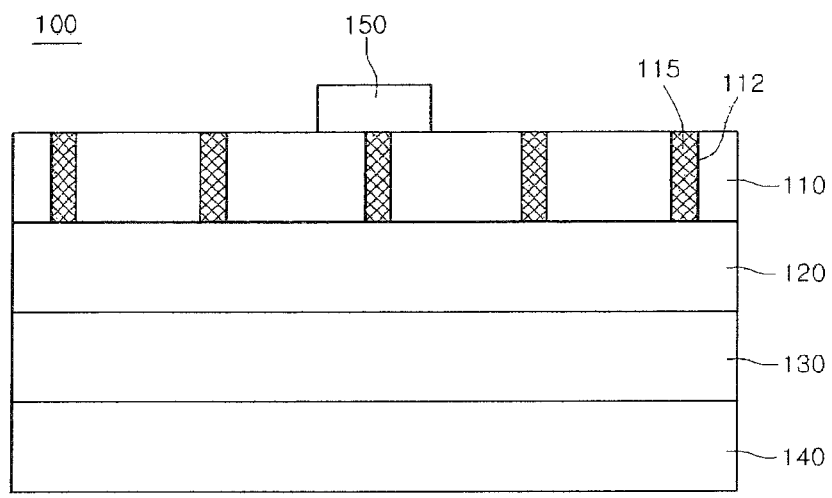
FIG. 1 is a side sectional view showing a light emitting device according to a first embodiment.

In the description of the embodiments, it will be understood that, when a layer (or film), a region, a pattern, or a structure is referred to as being "on" or "under" other substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 2:
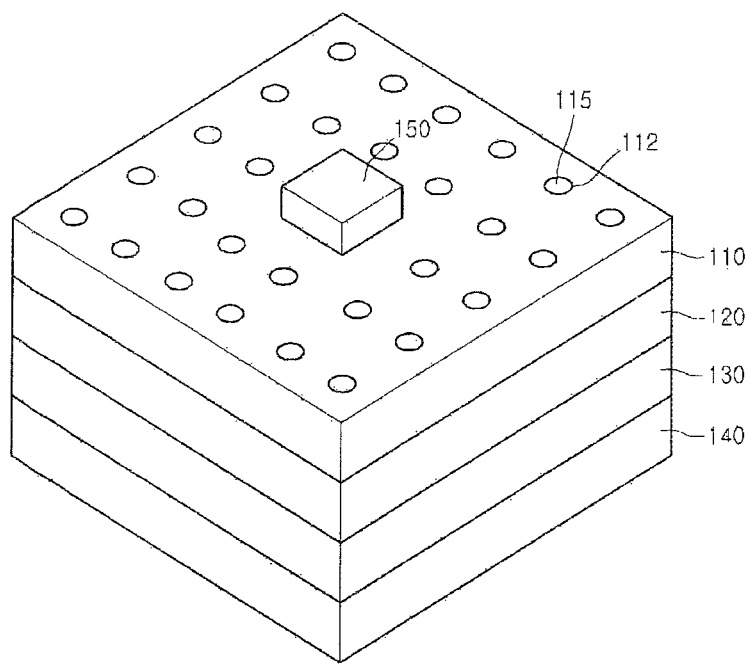
FIG. 2 is a perspective view.

FIG. 1 is a sectional view showing a light emitting device 100 according to a first embodiment, and FIG. 2 is a perspective view showing the light emitting device 100 of FIG. 1.

Referring to FIGS. 1 and 2, the light emitting device 100 includes a first conductive type semiconductor layer 110, an active layer 120, a second conductive type semiconductor layer 130, an electrode layer 140, and an electrode 150.

The first conductive type semiconductor layer 110 has a composition formula of $In_xAl_yGa_{1-x-y}N$ ($0 \leq x \leq 1$, $0 \leq y \leq 1$, $0 \leq x+y \leq 1$). The first conductive type semiconductor layer 110 may include one of group III-V compound semiconductors, such as GaN, InN, AlN, InGaN, AlGaN, InAlGaN, and AlInN, doped with first conductive dopants. When the first conductive type semiconductor layer 110 is a P-type semiconductor layer, the first conductive dopant serves as a P-type dopant, and includes at least one of Mg, Zn, Ca, Sr and Ba. The first conductive type semiconductor layer 110 formed in the P-type semiconductor layer has a thickness thicker than a thickness of the second conductive type semiconductor layer 130.

A plurality of holes 112 are formed in the first conductive type semiconductor layer 110, and the holes 112 have the form of a through hole or a via hole. An insulating material 115 may be filled in the hole 112. The insulating material 115 may include at least one selected from the group consisting of silicon oxide-based materials such as $SiO_2$ and $Si_xO_y$, and silicon nitride-based materials such as $Si_3N_4$, $Si_xN_y$, and $SiO_xN_y$, but the embodiment is not limited thereto.

The insulating material 115 is partially filled in at least one of the holes 112, and void space, air gap, or a void area (hereinafter, collectively referred to as "void space) is filled in a remaining portion of the holes 112. The insulating material 115 has a refractive index lower than that of a semiconductor material, and greater than that of the void space.

In the hole region provided therein with the void space and the insulating material 115, the critical angle of forwarding light may be changed due to a refractive index difference of the void space, the insulating marital 115, and the semiconductor material. If such a critical angle is changed, light extraction efficiency can be improved.

The holes 112 may be formed at a regular interval or an irregular interval. The holes 112 may be arranged in the form of a cylinder or a polygonal prism in a predetermined region of the first conductive type semiconductor layer 110. The holes 112 may have the same height and the same width, but the embodiment is not limited thereto.

The insulating material 115 may be formed with the height identical to the thickness of the first conductive type semiconductor layer 110. The insulating material 115 may make contact with the active layer 120 or a first conductive clad layer. For example, the void space may be provided between the insulating material 115 and the active layer 120 or the insulating material 115 and the first conductive clad layer.

The electrode 150 may be formed on the first conductive type semiconductor layer 110. The electrode 150 may partially overlap with the insulating material 115.

The first conductive type semiconductor layer 110 may be provided on a top surface thereof with roughness or a pattern. The insulating material 115 blocks the flow of current, so that current can be diffused.

The active layer 120 is formed under the first conductive type semiconductor layer 110. The active layer 120 may have one of a single quantum structure, a multi-quantum well structure, a quantum wire structure, and a quantum dot structure. The active layer 120 may have a stack structure of a well layer and a barrier layer, which includes group III-V compound semiconductor materials. For example, the active layer 120 may have a stack structure of an InGaN well layer/a GaN barrier layer, an InGaN well layer/an AlGaN barrier layer, or an InGaN well layer/an InGaN barrier layer, but the embodiment is not limited thereto.

A conductive clad layer may be formed on and/or under the active layer 120, and may include a GaN-based semiconductor layer. The barrier layer may have a band gap higher than that of the well layer, and the conductive clad layer may have a band gap higher than the barrier layer.

The active layer 120 may include a material emitting light in a visible ray band (e.g., light having blue, red, or green wavelength) or light in an ultraviolet (UV) band. The conductive clad layer may be formed on and/or under the active layer 120, and may include a GaN-based semiconductor.

The second conductive type semiconductor layer 130 is formed under the active layer 120. The second conductive type semiconductor layer 130 has a composition formula of $In_xAl_yGa_{1-x-y}N$ ($0 \leq x \leq 1$, $0 \leq y \leq 1$, $0 \leq x+y \leq 1$). The second conductive type semiconductor layer 130 includes a group III-V compound semiconductor such as GaN, InN, AlN, InGaN, AlGaN, or InAlGaN, AlInN doped with second conductive dopants. When the second conductive type semiconductor layer 130 includes an N-type semiconductor, the second conductive dopant is an N-type dopant and includes Si, Ge, Sn, Se, or Te.

A third conductive type semiconductor (not shown) such as a P-type semiconductor may be interposed between the second conductive type semiconductor layer 130 and the electrode layer 140.

The electrode layer 140 is formed under the second conductive type semiconductor layer 130. The electrode layer 140 may act as an electrode and/or a conductive support member. The first conductive type semiconductor layer 110, the active layer 120, and the second conductive type semiconductor layer 130 may have the same width, and the electrode layer 140 may have a width at least wider than that of the second conductive type semiconductor layer 130.

The electrode layer 140 may include an ohmic contact layer making ohmic contact with the second conductive type semiconductor layer 130. The ohmic contact layer may include a metallic material or a conductive oxide material such as indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), or gallium zinc oxide (GZO). The electrode layer 140 may include one selected from the group consisting of Ag, Ni, Al, Rh, Pd, Ir, Ru, Mg, Zn, Pt, Au, Hf, and selective combination thereof in a single layer structure or a multiple layer structure. The electrode layer 140 may have a stack structure of IZO/Ni, AZO/Ag, IZO/Ag/Ni, or AZO/Ag/Ni.

The electrode layer 140 includes an ohmic contact layer or a reflective layer. In this case, the ohmic contact layer makes contact with a lower portion of the second conductive type semiconductor layer 130, and the reflective layer may be formed under the ohmic contact layer.

The electrode layer 140 may include a conductive support member. The conductive support member may be bonded with a lower portion of the electrode layer 140 or may be attached to the lower portion of the electrode layer 140 in the form of a sheet. The conductive support member may include copper (Cu), gold (Au), nickel (Ni), molybdenum (Mo), copper-tungsten (Cu—W), or a carrier wafer such as Si, Ge, GaAs ZnO, SiC, SiGe, or GaN.

The conductive support member may be bonded with the lower portion of the electrode layer 140. In detail, the electrode layer 140 may be bonded with the conductive support member through a bonding layer. The bonding layer may include barrier metal or bonding metal. For example, the bonding layer may include at least one of Ti, Au, Sn, Ni, Cr, Ga, In, Bi, Cu, Ag and Ta.

An insulating substrate may be bonded with the lower portion of the electrode layer 140. In detail, the electrode layer 140 may be electrically connected through a via structure or another connection structure formed in the insulating substrate.

The light emitting device 100 is a chip without a growth substrate. The electrode 150 may be provided on the P-type semiconductor layer 110 or electrically connected with the P-type semiconductor layer 100. The electrode layer 140 may be formed under the second conductive type semiconductor layer 130. In the light emitting device 100, the electrode 150 may be opposite to the electrode layer 140, and the P-type semiconductor layer 110 is provided at an upper portion of a device. In addition, at least 40% of a top surface of the P-type semiconductor layer 110 is open at an upper portion of the chip.

FIGS. 3 to 15 are views showing a method of manufacturing the light emitting device according to the second embodiment.

Figure 3:
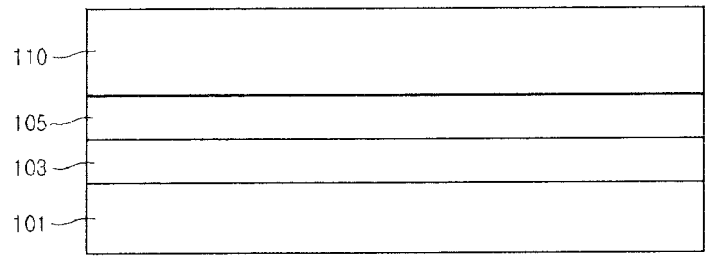
FIGS. 3 to 15 are views showing a method of manufacturing the light emitting device according to a second embodiment.

Referring to FIG. 3, a substrate 101 is loaded into growth equipment. The substrate 101 may be formed thereon with a group II to VI compound semiconductor having a composition formula of $In_xAl_yGa_{1-x-y}N$ ($0 \leqq x \leqq 1$, $0 \leqq y \leqq 1$, $0 \leqq x+y \leqq 1$).

The substrate 101 may include at least one of $Al_2O_3$, SiC, Si, GaAs, GaN, ZnO, Si, GaP, InP, and Ge.

The growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the above growth equipment.

A buffer layer may be formed on the substrate 101. The buffer layer includes a group III-V compound semiconductor, and reduces the lattice constant difference between the substrate 101 and the nitride semiconductor. An undoped semiconductor layer 103 may be formed on the buffer layer, and the undoped semiconductor layer 103 may include a group III-V compound semiconductor which is not doped with a conductive dopant. At least one of the buffer layer and the undoped semiconductor 103 may not be formed, but the embodiment is not limited thereto.

A sacrificial layer 105 is formed on the undoped semiconductor layer 103, and the sacrificial layer 105 may have a composition formula of $In_xAl_yGa_{1-x-y}N$ ($0 \leqq x \leqq 1$, $0 \leqq y \leqq 1$, $0 < x+y \leqq 1$) and may be defined as an AlN-based layer. The sacrificial layer 105 may include a semiconductor including aluminum (Al). For example, the sacrificial layer 105 includes AlN, AlGaN, AlInN, or AlInGaN, and is not doped with conductive dopants. In addition, the sacrificial layer 105 has a dopant density lower than that of a conductive type semiconductor layer.

If the sacrificial layer 105 includes AlN, nitride and/or hydrogen atmosphere gas is supplied under the condition of a predetermined temperature. In addition, trimethyl aluminum (TMAl) gas is supplied as source gas for aluminum (Al), and group V gas such as ammonia ($NH_3$) gas, monomethyl hydrazine (MMHy) gas or dimethylhydrazine gas (DMHy) is used as source gas for nitrogen (N). The sacrificial layer 105 may have a thickness of about 0.5 μm or less.

The sacrificial layer 105 may include a material having an etching rate higher than that of other layers 103 and 110. The etching rate represents an etching degree of a wet etching scheme. Etchant for the wet etching scheme may include one selected the group consisting of BOE, phosphoric acid, KOH, HF, and $H_2SO_4$ applied to a nitride semiconductor.

The first conductive type semiconductor layer 110 is formed on the sacrificial layer 105, and may include a material having a composition formula of $In_xAl_yGa_{1-x-y}N$ ($0 \leqq x \leqq 1$, $0 \leqq y \leqq 1$, $0 < x+y \leqq 1$). The first conductive type semiconductor layer 110 may include a semiconductor doped with first conductive dopants. For example, the first conductive type semiconductor layer 110 may include one of compound semiconductors such as GaN, InN, AlN, InGaN, AlGaN, InAlGaN, and AlInN. When the first conductive type semiconductor layer 110 is a P-type semiconductor, the first conductive dopant is a P-type dopant, and may include at least one of Mg, Zn, Ca, Sr, and Ba.

The P-type semiconductor layer 110 may include a material having an etching rate lower than that of the sacrificial layer 105. The P-type semiconductor layer may include a material having an etching rate lower than that of the sacrificial layer 105.

Figure 4:
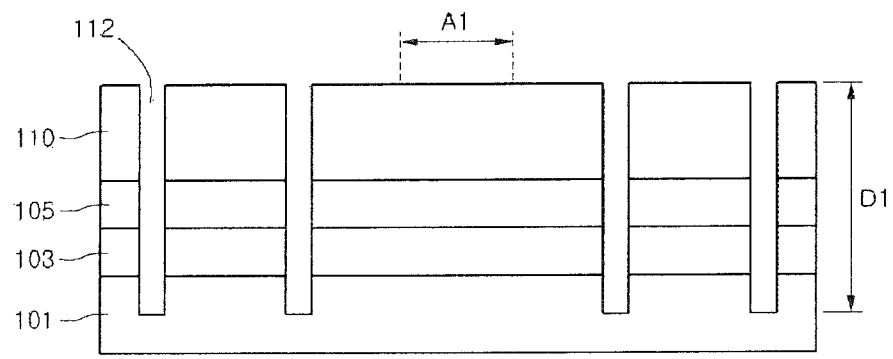

Referring to FIG. 4, a plurality of holes 112 are formed with a predetermined depth D1 from the first conductive type semiconductor layer 110. The holes 112 may be formed through a dry etching scheme, but the embodiment is not limited thereto.

The depth D1 of the holes 112 may be formed to the extent that the substrate 101 is exposed. The depth D1 of the holes 112 may be an exposure depth of the sacrificial layer 105, the undoped semiconductor layer 103, or the substrate 101.

The holes 112 may be formed at a regular interval or an irregular interval throughout the whole region of the sacrificial layer 105. In addition, the holes 112 may be formed in a predetermined shape at chip boundary regions excluding a first region A1. For example, the holes 112 may have the form of a dot matrix. The chip boundary region may be an edge region of an individual chip.

After forming a mask pattern through a photoresist process, the holes 112 may be etched through a predetermined process such as exposure, but the embodiment is not limited thereto.

Figure 5:
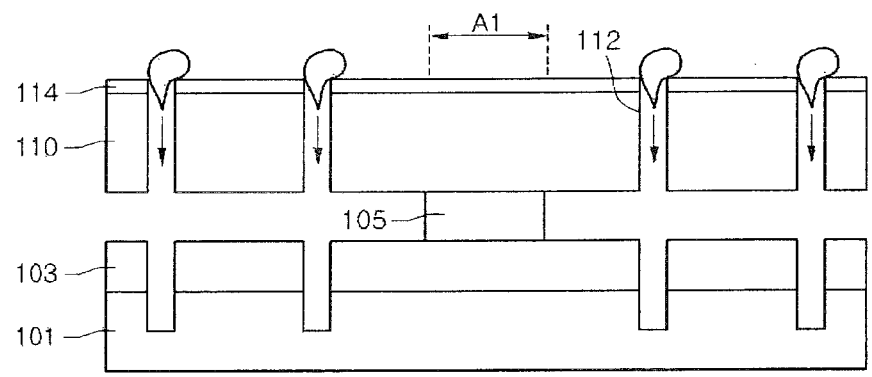

FIG. 5 shows a first etching process. For example, the first etching includes a wet etching process. According to the first etching process, after forming a mask pattern with respect to a region excluding the holes 112, a wet etchant is injected through the holes 112. The wet etchant etches the sacrificial layer 105. In other words, the wet etchant etches a material having the highest etching rate among layers in the holes 112, for example, the sacrificial layer 105. The sacrificial layer 105 is etched except for the first region A1. The first region A1 may be at least a portion of a boundary region between chips or at least a portion of an edge region. For example, the first region A1 may be placed at a center of a layer. A single first region A1 or a plurality of first regions A1 may be formed at a peripheral region of the layer. However, the embodiment is not limited to the first region A1. The distance between the first region A1 and the hole 112 may be shorter than the length of one side of a chip.

The sacrificial layer 105 exists at the first region A1 between the first conductive type semiconductor layer 110 and the undoped semiconductor layer 103. In this case, the sacrificial layer 105 may be formed in the shape of a pit (e.g., V-shape pit) or in a polygonal shape under the first conductive type semiconductor layer 110.

Figure 6:
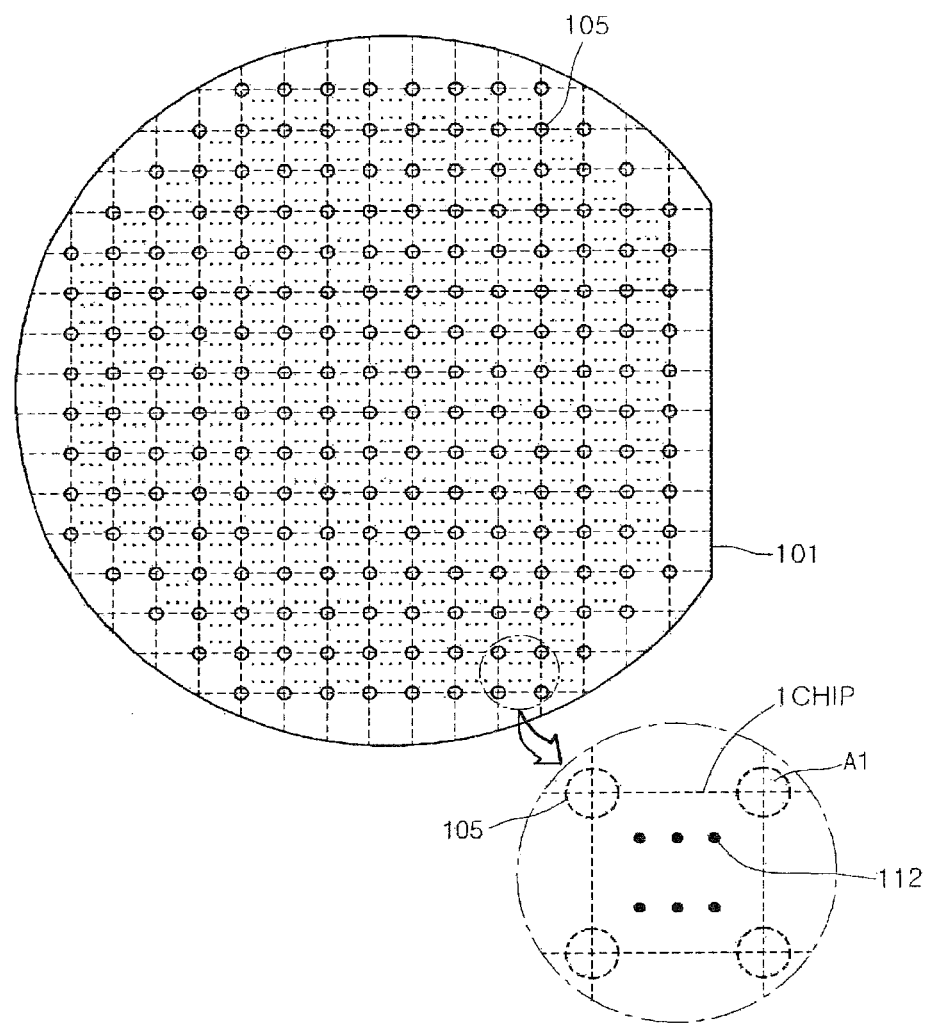

Referring to FIGS. 5 and 6, the first region A1 of the sacrificial layer 105 may corresponding to an edge of a boundary region between chips, and may be arranged in the form of a matrix on a wafer. In this case, the position of the first region A1 is adjusted based on etching time and a hole position while taking the size of an individual chip and the distance between chips into consideration. In addition, the sacrificial layer 105 may be arranged at a predetermined position along the edge of each chip.

Figure 7:
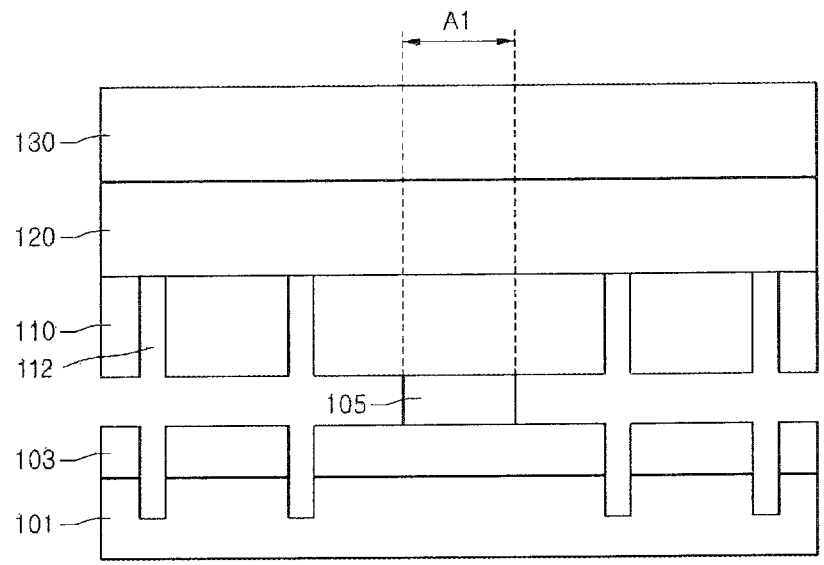

Referring to FIG. 7, the active layer 120 is formed on the first conductive type semiconductor layer 110, and the second conductive type semiconductor layer 130 is formed on the active layer 120.

Although the embodiment has been described in that the holes 112 are formed after the first conductive type semiconductor layer 110 has been formed, the holes 112 may be formed after the active layer 120 or the second conductive type semiconductor layer 130 has been formed. Accordingly, the holes 112 may be formed in the active layer 120 and/or the second conductive type semiconductor layer 130.

The active layer 120 may have a single quantum well (SQw) structure, a multiple quantum well (MQW) structure, a quantum wire structure, or a quantum dot structure. The active layer 120 may have a stack structure including a well layer and a barrier layer, which are made from group III-V compound semiconductor materials. The well layer may include a semiconductor layer having a compositional formula of $In_xAl_yGa_{1-x-y}N$ ($0 \leq x \leq 1$, $0 \leq y \leq 1$, $0 \leq x+y \leq 1$), and the barrier layer may include a semiconductor layer having a compositional formula of $In_xAl_yGa_{1-x-y}N$ ($0 \leq x \leq 1$, $0 \leq y \leq 1$, $0 \leq x+y \leq 1$). For example, the active layer 120 may have a stack structure of an InGaN well layer/GaN barrier layer or a GaN well layer/AlGaN barrier layer.

The active layer 120 may include a material emitting light in a visible ray band such as light having blue, red, or green wavelength, or light in a UV band. The conductive clad layer may be formed on and/or under the active layer 120, and may include a GaN-based semiconductor. The barrier layer may include a material having a band gap higher than that of the well layer, and the conductive clad layer may include a material having a band gap higher than that of the barrier layer.

The second conductive type semiconductor layer 130 is formed on the active layer 120, and may include a material having a composition formula of $In_xAl_yGa_{1-x-y}N$ ($0 \leq x \leq 1$, $0 \leq y \leq 1$, $0 \leq x+y \leq 1$). The second conductive type semiconductor layer 130 includes a group III-V compound semiconductor such as GaN, InN, AlN, InGaN, AlGaN, InAlGaN, or AlInN doped with second conductive dopants. When the second conductive type semiconductor layer 130 includes an N-type semiconductor, the second conductive dopant is an N-type dopant and includes Si, Ge, Sn, Se, or Te.

A P-type semiconductor layer may be formed on the second conductive type semiconductor layer 130. Accordingly, a light emitting structure layer may include one of an N-P junction structure, a P-N junction structure, an N-P-N junction structure, and a P-N-P junction structure.

Figure 8:
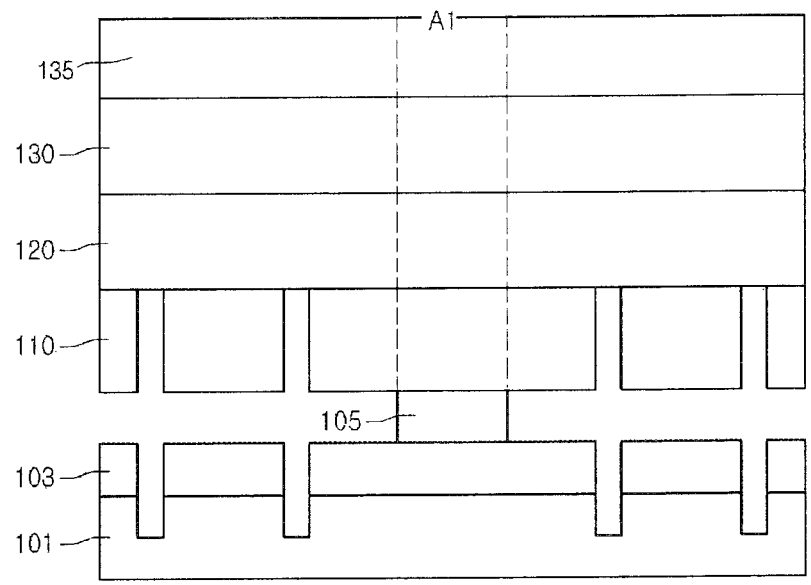
Figure 9:
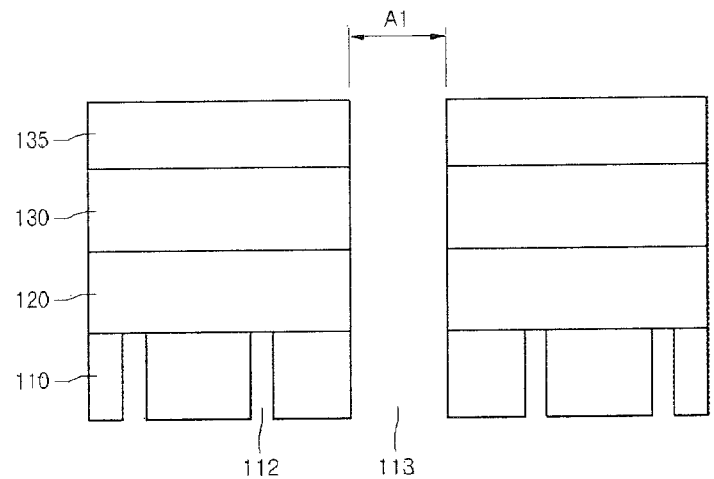

Referring to FIGS. 8 and 9, a first support sheet 135 is attached onto the second conductive type semiconductor layer 130. The first support sheet 135 may include an insulating sheet or a conductive sheet having a predetermined thickness. In addition, the first support sheet 135 may include a transmissive material.

According to another embodiment, after an electrode pattern or an electrode layer has been formed, the first support sheet 135 may be attached to the second conductive type semiconductor layer 130, but the embodiment is not limited thereto.

The first region A1 is removed through a second etching process by using a mask pattern on the first support sheet 135. For example, the second etching process may be a dry etching process. Through the second etching process, a region vertically overlapping with the first region A1 may be removed. A vertically direction may be a thickness direction of the semiconductor layers.

The dry etching process may be performed until the sacrificial layer 105 is exposed or removed through the first support sheet 135. When the sacrificial layer 105 is exposed or removed, the first region A1 is removed, so that the substrate 101 may be separated. Accordingly, since the substrate 101 may be removed without performing a laser lift off (LLO) process using a laser, the LLO process may be omitted. In addition, the damage of the light emitting structure layer resulting from the LLO process can be prevented.

After the substrate 101 has been removed, as shown in FIG. 9, a hole 113 having a size corresponding to the first region A1 is formed in the semiconductor layers 110, 120, and 130, and the first support sheet 135, and the first support sheet 135 supports a top surface of a chip.

Figure 10:
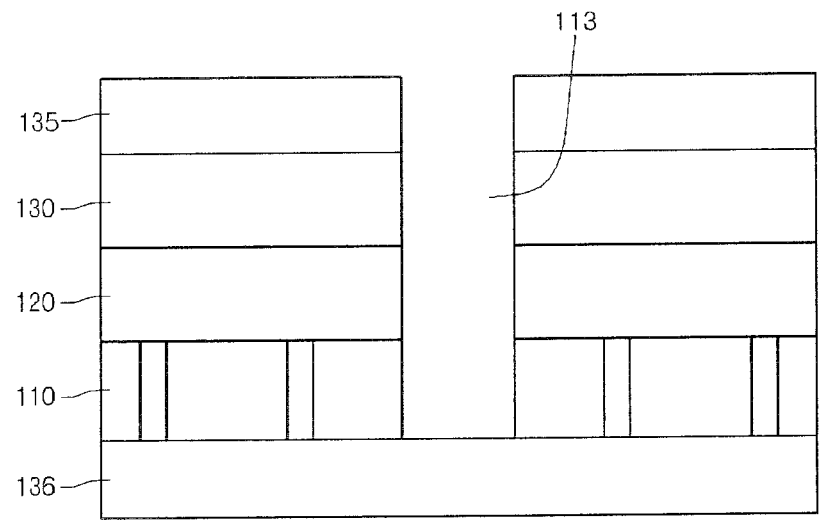
Figure 11:
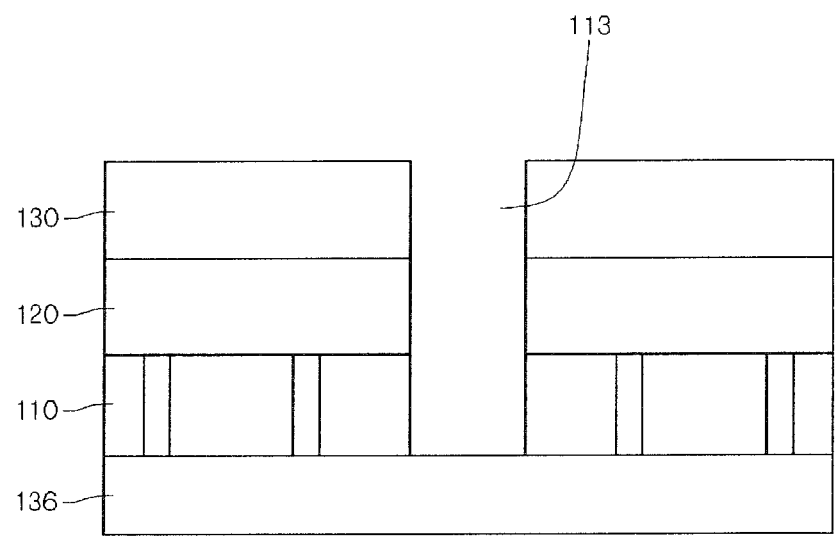
Figure 12:
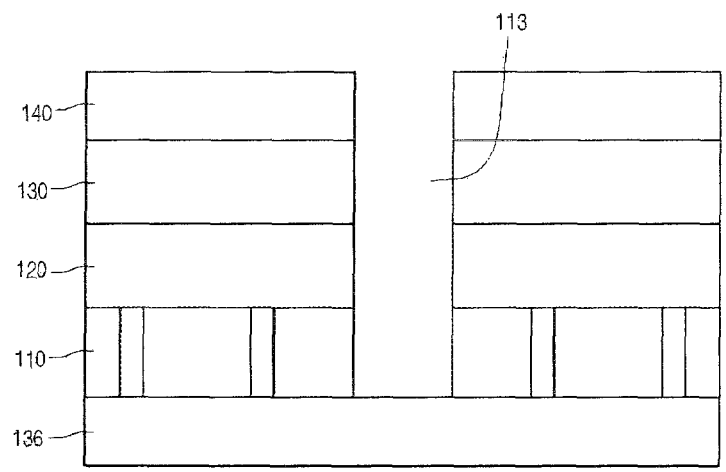

Referring to FIGS. 9 and 10, a second support sheet 136 may be attached on the first conductive type semiconductor layer 110. In this case, after forming the electrode 150 (see FIG. 14) on the first conductive type semiconductor layer 110, the second support sheet 136 may be attached to the first conductive type semiconductor layer 110.

Referring to FIGS. 9 and 10, after removing the first support sheet 135, the electrode layer 140 is formed on the first support sheet 135. When the electrode layer 140 is formed, the hole 113 may be protected by using a mask pattern, or may be filled with an insulating material such that the electrode layer 140 is not formed in the hole 113. The electrode layer 140 may act as an electrode and/or a conductive support member. The electrode layer 140 may include at least one of an ohmic contact layer making ohmic contact with the second conductive type semiconductor layer 130, an electrode layer, and a reflective layer. The electrode layer 140 may include at least one layer including at least one material selected from the group consisting of ITO, IZO, IZTO, IAZO, IGZO, IGTO, AZO, ATO, GZO, Ag, Ni, Al, Rh, Pd, Ir, Ru, Mg, Zn, Pt, Au, Hf, and the combination thereof.

The electrode layer 140 may include a conductive support member, and the conductive support member may be bonded with a lower portion of the electrode layer 140 or attached to the lower portion of the electrode layer 140. The conductive support member may include one selected from the group consisting of Cu, Au, Ni, Mo, Cu—W, or a carrier wafer such as Si, Ge, GaAs, ZnO, SiC, SiGe, or GaN.

An insulating substrate (not shown) may be attached on the electrode layer 140, and the electrode layer 140 may be electrically connected through a via structure or another connection structure formed in the insulating substrate.

The conductive support member may be bonded with the lower portion of the electrode layer 140. In detail, the electrode layer 140 may be bonded with the conductive support member through a bonding layer. The bonding layer may include barrier metal or bonding metal. For example, the bonding layer may include at least one of Ti, Au, Sn, Ni, Cr, Ga, In, Bi, Cu, Ag and Ta An insulating substrate (not shown) may be attached to a lower surface of the electrode layer 140, and the electrode layer 140 may be electrically connected through a via structure or another connection structure formed in the insulating substrate.

Figure 13:
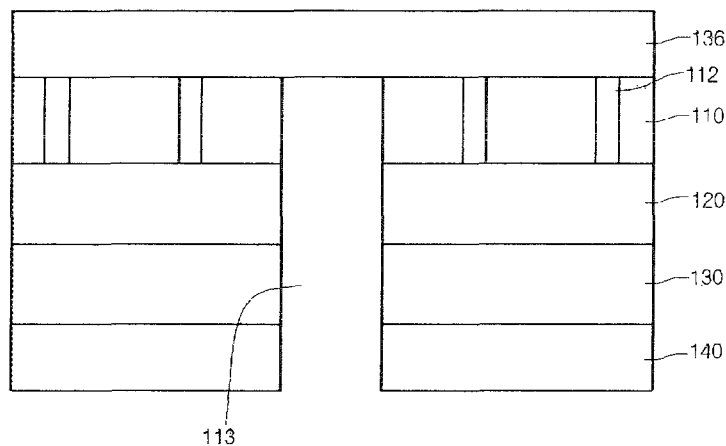
Figure 14:
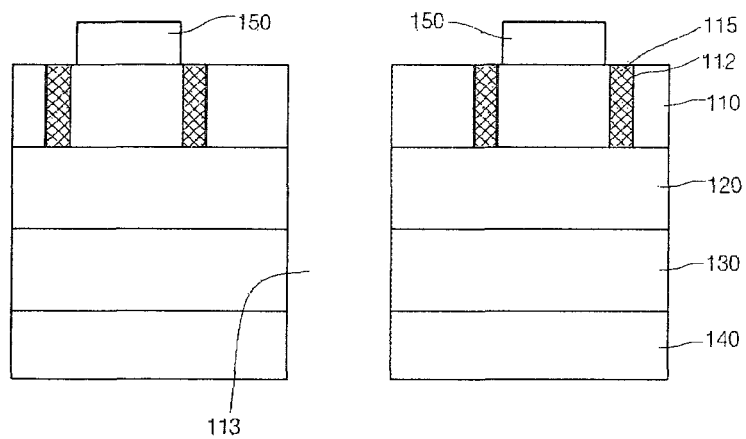

Referring to FIGS. 13 and 14, the electrode layer 140 is provided on a base, and the first conductive type semiconductor layer 110 is provided on a top. The insulating material 115 may be filled in the hole 112 of the first conductive type semiconductor layer 110. For example, the insulating material 115 may include at least one of silicon-oxide-based materials ($SiO_2$ and $Si_xO_y$), silicon-nitride-based materials ($Si_3N_4$, $Si_xN_y$, and $SiO_xN_y$), and $Al_2O_3$, but the embodiment is not limited thereto.

After the second support sheet 136 is removed, the insulating material 115 may be filled in the hole 112. At least one of the holes 112 may include the insulating material 115 and a void space. The void space may be formed under the insulating material 115 in the hole 112. Light extraction efficiency can be improved due to the difference in a refractive index between the insulating material 112 and the semiconductor material. In addition, the critical angle of light can be changed due to the difference in a refractive index among the insulating material 115, the void space, and the semiconductor material. Accordingly, light extraction efficiency can be improved.

The electrode 150 is formed on the first conductive type semiconductor layer 110. At least one electrode 150 may be provided on an individual chip, but the embodiment is not limited thereto. The electrode 150 may include a material making ohmic contact such as a metallic material. The electrode 150 may include one selected from the group consisting of Ti, Al, In, Ta, Pd, Co, Ni, Si, Ge, Ag, Au, and the combination thereof.

A roughness or a pattern may be formed on the top surface of the first conductive type semiconductor layer 110, and may have various shapes according to light extraction efficiency.

Figure 15:
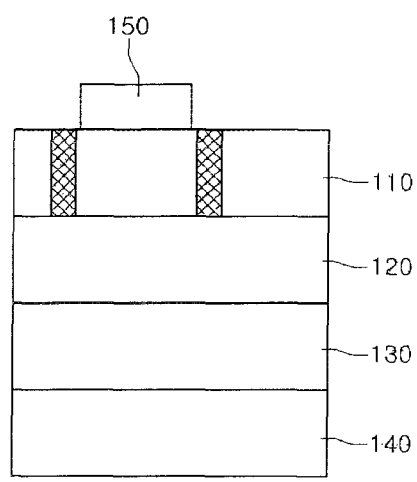

Referring to FIGS. 14 and 15, a laser scribing process, or a cutting and/or backing process is performed with respect to a boundary region between chips to divide the electrodes layers 140 corresponding to the size of an individual chip, so that the light emitting device shown in FIG. 15 may be manufactured.

The light emitting device has a structure in which a growth substrate is removed, and the electrode 150 may be provided on the P-type semiconductor layer 110 or may be electrically connected to the P-type semiconductor layer 110. The electrode layer 140 may be formed under the second conductive type semiconductor layer 130.

In the light emitting device, the electrode 150 is provided in opposition to the electrode layer 140, and the P-type semiconductor layer 110 is provided on a top of a device. In addition, at least 40% of the top surface of the P-type semiconductor layer 110 is open at an upper portion of the chip.

The insulating material 115 may have a height identical to the thickness of the first conductive type semiconductor layer 110. The insulating material 115 may make contact with the active layer 120 or the first conductive clad layer. The void space may be interposed between the insulating material 115 and the active layer 130, or between the insulating material 115 and the first conductive clad layer 110.

Figure 16:
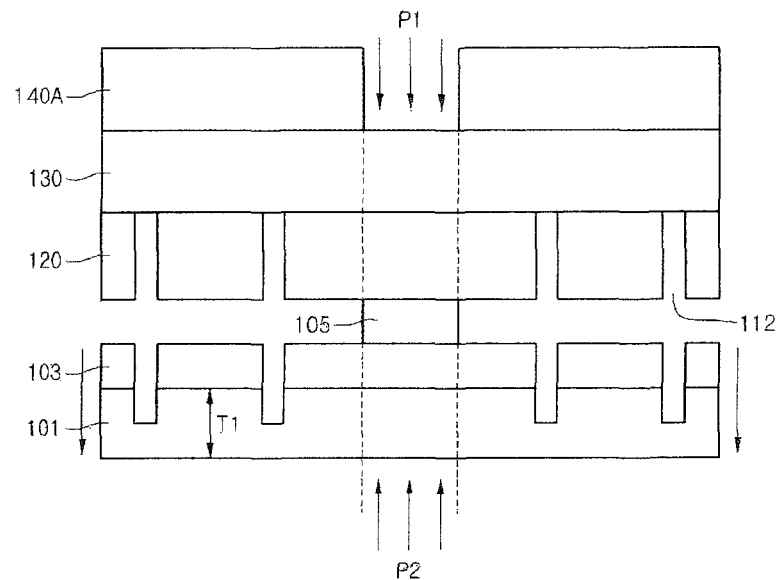
FIG. 16 is a view showing another example of the method of manufacturing the light emitting device according to the embodiment.

FIG. 16 shows another example of separating the substrate. Hereinafter, the description related to FIG. 16 will be made based on the second embodiment.

Referring to FIG. 16, according to a process of removing the substrate 101, after attaching an electrode layer or a support sheet 140A on the second conductive type semiconductor layer 130, an etching process may be performed in a first direction P1 through the second conductive type semiconductor layer 130. In contrast, the etching process may be performed in a second direction P2. The substrate 101 may be polished with a predetermined thickness of T1 before the etching process is performed, but the embodiment is not limited thereto. Accordingly, when removing the sacrificial layer 105 remaining at least one chip boundary region, for example, a first region under the first conductive type semiconductor layer 120, the etching process may be performed from the upper portion of the chip or from the lower portion of the chip. Accordingly, the undoped semiconductor layer 103 and the substrate 101 may be separated from the first conductive type semiconductor layer 120.

Figure 17:
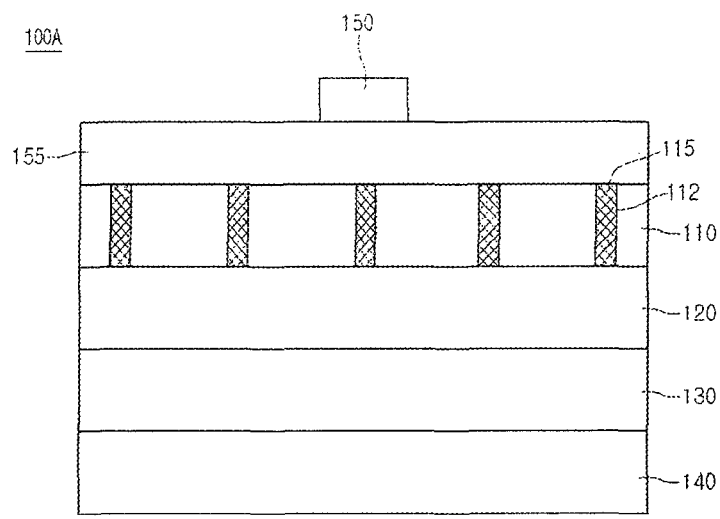
FIG. 17 is a side sectional view showing a light emitting device according to a fourth embodiment.
Figure 18:
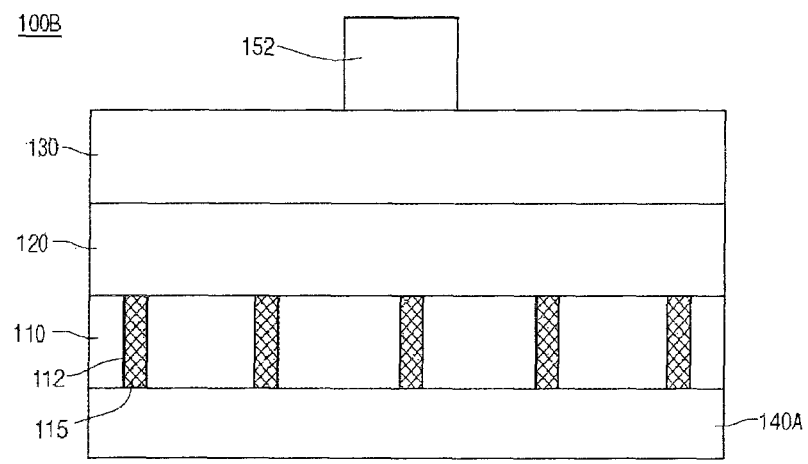
FIG. 18 is a side sectional view showing a light emitting device according to a fourth embodiment.

FIG. 17 is a side sectional view showing a light emitting device 100A according to a third embodiment. In the following description, the same reference numerals will be assigned to elements identical to those of the first embodiment, and details thereof will be omitted in order to avoid redundancy.

Referring to FIG. 17, the light emitting device 100A is a device modified through the process of the first embodiment. A transmissive electrode layer 155 may be formed on or under a semiconductor layer and may be defined as a transparent electrode layer. For example, a transmissive electrode layer 155 is formed on the first conductive type semiconductor layer 110, and the electrode 150 may be formed on the transmissive electrode layer 155. The transmissive electrode layer 155 may include at least one of ITO, IZO, IZTO, IAZO, IGZO, IGTO, AZO, and ATO. In addition, a reflective electrode layer may be provided on the first conductive type semiconductor layer 110, and may include one selected from the group consisting of Al, Ag, Pd, Rh, Pt, and Ir.

The transmissive electrode layer 155 or the reflective electrode layer may have a width greater than that of the electrode 150, and may have a width substantially identical to that of the first conductive type semiconductor layer 110. The electrode 150 may directly or indirectly make contact with at least one layer of the transmissive electrode layer 155 and the first conductive type semiconductor layer 110.

FIG. 17 is a side sectional view showing a light emitting device 100B according to a fourth embodiment. In the following description, the same reference numerals will be assigned to elements identical to those of the first embodiment, and details thereof will be omitted in order to avoid redundancy.

Referring to FIG. 17, the light emitting device 100B is a device modified through the process of the first embodiment. In the light emitting device 100B, the first conductive type semiconductor layer 110 is provided at the lower of the chip, and the second conductive type semiconductor layer 130 is provided at the upper portion of the chip. In the manufacturing process of FIGS. 12 and 13, the electrode layer 140A and the electrode 152 may be formed on the resultant structure of the first conductive type semiconductor layer 110, the active layer 120, and the second conductive type semiconductor layer 130 instead of the electrode layer 140.

The electrode layer 140A may be formed under the first conductive type semiconductor layer 110. The electrode layer 140A makes ohmic contact with the first conductive type semiconductor layer 110. In addition, the electrode layer 140A may include a reflective material. The electrode layer 140A may include at least one layer including at least one selected from the group consisting of ITO, IZO, IZTO, IAZO, IGZO, IGTO, AZO, ATO, Ag, Ni, Al, Rh, Pd, Ir, Ru, Mg, Zn, Pt, Au, Hf and the combination thereof.

The reflective layer 140A may include an ohmic contact layer and a reflective layer. The ohmic contact layer may be formed under the first conductive type semiconductor layer 110, and the reflective layer may be formed under the ohmic contact layer.

The insulating material 115 may have a height identical to the thickness of the first conductive type semiconductor layer 110. The insulating material 115 may make contact with the active layer 120 or the electrode layer 40A. The void space may be interposed between the insulating material 115 and the active layer 120. The insulating material 115 may diffuse current into another material.

The void space in the hole 112 may be closer to a lower surface of the active layer 120 than a lower surface of the first conductive type semiconductor layer 110.

The electrode layer 140A may further include a conductive support member. The conductive support member may be attached to or bonded with a lower portion of the electrode layer 140A. The conductive support member may be coated on the electrode layer 140A.

A roughness or a pattern may be formed on the top surface of the second conductive type semiconductor layer 130, but the embodiment is not limited to the roughness or the pattern.

In addition, an electrode 152 may be formed on the second conductive type semiconductor layer 130, and a transmissive electrode layer may be formed between the second conductive type semiconductor layer 130 and the electrode 152. The electrode 152 may have the shape of an electrode pad or an arm, but the embodiment is not limited thereto.

Figure 19:
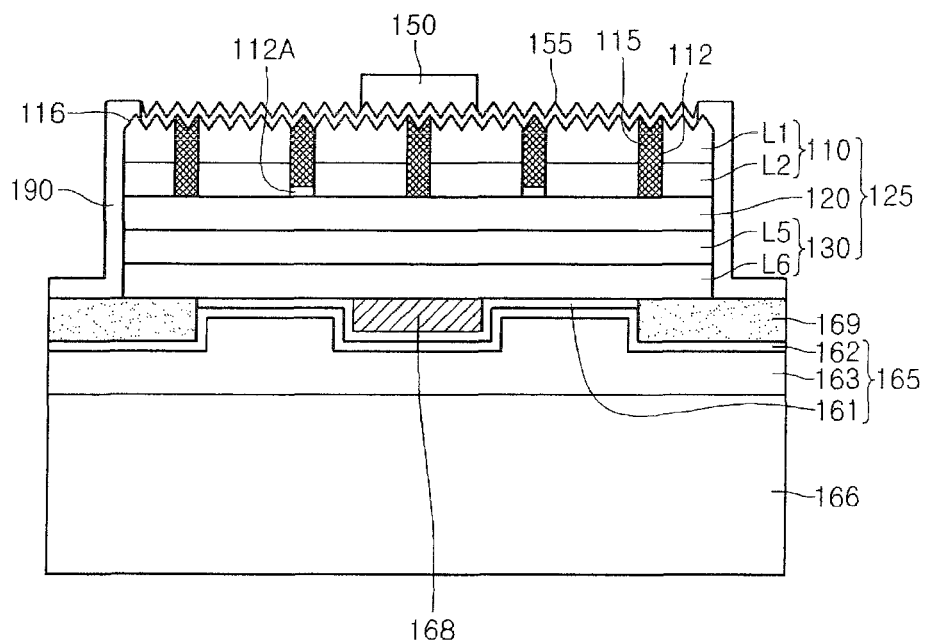
FIG. 19 is a sectional view showing a light emitting device package according to a fifth embodiment.

FIG. 19 is a sectional view showing a light emitting device according to the fifth embodiment.

Referring to FIG. 19, the light emitting device includes the first conductive type semiconductor layer 110, the active layer 120, the second conductive type semiconductor layer 130, a current blocking layer 168, a protective layer 169, a conductive layer 165, and a support member 166.

The first conductive type semiconductor layer 110 includes first and second semiconductor layers L1 and L2, and the first and second semiconductor layers L1 and L2 include a P type semiconductor layer.

The first semiconductor layer L1 is a semiconductor layer having P type dopant concentration higher than that of the second semiconductor layer L2, and the second semiconductor layer L2 has conductivity lower than that of first semiconductor layer L1. The first semiconductor layer L1 can horizontally spread current, and the second semiconductor layer L2 serves as a high resistance layer such that current can be spread within the first semiconductor layer L1.

The first semiconductor layer L1 and the second semiconductor layer L2 may have a superlattice structure formed by staking semiconductor layers having different band gaps. The supperlattice structure includes a GaN/InGaN structure or a GaN/AlGaN structure. The supperlattice structure may include a structure in which at least two pairs of two different layers having a thickness of a few Å or more are alternately stacked.

The first semiconductor layer L1 and the second semiconductor layer L2 may have different refractive indexes. For example, the first semiconductor layer L1 has a lower refractive index, and the second semiconductor layer L2 may have a higher refractive index than the refractive index of the first semiconductor layer L1. The difference in the refractive index between the two layers can improve light extraction efficiency. In addition, the thickness of the first semiconductor layer L1 may be thicker than the thickness of the second semiconductor layer L2.

The insulating material 115 is filled in the holes 112 of the first conductive type semiconductor layer 110, and a void space 112A may be formed between the insulating material 115 and the active layer 120 in at least one hole 112. The critical angle of light may be changed due to the difference in the refractive index between materials constituting the void space 112A and the peripheral portion thereof, so that the light extraction efficiency can be improved. The refractive index of the void space 112A is about 1, and the refractive index of the semiconductor layer is about 2.4. The refractive index of the insulating material 115 is less than that of the semiconductor layer, and greater than that of the void space 112A. In detail, the refractive index of the insulating material 115 is in the range of about 1.4 to about 2.1.

In the hole 112, the void space 112A may be closer to the top surface of the active layer 120 than to the top surface of the first conductive type semiconductor layer 110.

A light extraction structure 116 may be formed on the top surface of the first conductor layer L1, and the light extraction structure 116 may include a concavo-convex structure or a roughness structure formed on the top surface of the first semiconductor layer L1. The light extraction structure 116 may be patterned, and may include at least one a hemispherical shape, a polygonal shape, a triangular pyramid shape, and a nano-column shape.

The light extraction structure 116 formed on the top surface of the first conductive type semiconductor layer 110 may change the critical angle of light incident into the first conductive type semiconductor layer 110, so that the light extraction efficiency can be improved.

The transmissive electrode layer 155 may be additionally formed on the first conductive type semiconductor layer 110, and may include metal oxide or metal nitride. For example, the transmissive electrode layer 155 may be selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ITON (ITO nitride), IZON (IZO nitride), IrOx, RuOx, RuOx/ITO, Ni/IrOx/Au, and Ni/IrOx/Au/ITO, but the embodiment is not limited thereto. The transmissive electrode layer 155 may include transmissive conductive material, and may act as a current spreading layer.

At least a part of the transmissive electrode layer 155 may serve as a concavo-convex layer by the top surface of the first conductive type semiconductor layer 110. The width and the area of the transmissive electrode layer 155 are at least greater than the width and the area of the electrode 150.

The lower surface of the electrode 150 may have a concavo-convex structure by the transmissive electrode layer 155, and the concavo-convex structure can reduce the light loss in the electrode 150. A part of the electrode 150 may direct contact with the first conductive type semiconductor layer 110, so that the adhesive strength of the electrode 150 can be increased, thereby preventing the electrode 150 from being peeled.

The second conductive type semiconductor layer 140 includes five and sixth semiconductor layers L5 and L6, and the five and sixth semiconductor layers L5 and L6 include an N type semiconductor layer.

The sixth semiconductor layer L6 is a semiconductor layer having N type dopant concentration higher than that of the fifth semiconductor layer L5, and the fifth semiconductor layer L5 has conductivity lower than that of the sixth semiconductor layer L6. The fifth semiconductor layer L5 can horizontally spread current, and the sixth semiconductor layer L6 serves as a high resistance layer such that current can be spread within the fifth semiconductor layer L5.

The thickness of the fifth semiconductor layer L5 may be thicker than the thickness of the sixth semiconductor layer L6, but the embodiment is not limited thereto.

The fifth semiconductor layer L5 and the sixth semiconductor layer L6 may have a superlattice structure formed by staking semiconductor layers having different band gaps. The supperlattice structure includes a GaN/InGaN structure or a GaN/AlGaN structure. The supperlattice structure may include a structure in which at least two pairs of two different layers having a thickness of a few Å or more are alternately stacked.

The fifth semiconductor layer L5 and the sixth semiconductor layer L6 may have different refractive indexes. For example, the fifth semiconductor layer L5 has a lower refractive index, and the sixth semiconductor layer L6 may have a high refractive index. After stacking at least two pairs of the fifth semiconductor layer L5 and the sixth semiconductor layer L6, the stack structure may be used as a DBR (Distributed bragg reflector) structure.

The first conductive type semiconductor layer 110, the active layer 120, and the second conductive type semiconductor layer 130 may be defined as the light emitting structure layer 125. The light emitting structure layer 125 may include at least one of a P-N junction structure and a P-N-P junction structure.

The conductive layer 165, the current blocking layer 168, and the protective layer 169 are formed under the light emitting structure layer 125.

The conductive layer 165 includes a plurality of conductive layer 161, 162, and 163. In detail, the conductive layer 165 may include at least two layers. The conductive layers 161, 162, and 163 may serve as an electrode layer. Hereinafter, the conductive layer 165 will be described by using the first to third conductive layers 161, 162, and 163.

The first conductive layer 161 makes ohmic contact with the lower surface of the second conductive type semiconductor layer 150A, and includes at least one selected from the group consisting of ITO, IZO, IZTO, IAZO, IGZO, IGTO, AZO, ATO, GZO, ITON, IZON, IrOx, RuOx, RuOx/ITO, Ni/IrOx/Au, Ni/IrOx/Au/ITO, Pt, Ni, Au, Rh and Pd.

The second conductive layer 162 is provided under the first conductive layer 161 to serve as a reflective layer. The second conductive layer 162 may include at least one of Ag, Ni, Al, Rh, Pd, Ir, Ru, Mg, Zn, Pt, Au, Hf.

The second conductive layer 162 may extend from a lower surface of the first conductive layer 161 to a lower surface of the protective member 169.

The third conductive layer 163 is provided under the second conductive layer 162 to serve as a barrier layer or a bonding layer, and may include at least one selected from the group consisting of Sn, Ga, In, Bi, Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—Cu2 O, Cu—Zn, Cu—P, Ni—B, Ni—Mn—Pd, Ni—P, and Pd—Ni. In addition, the third conductive layer 163 may have a single layer structure or a multiple layer structure.

The support member 166 may be formed under the third conductive layer 163. The support member 166 may include a conductive material. For example, the support member 166 may include a material such as Cu, Ag, or carrier wafer such as Ge, GaAs, ZnO, SiC, or SiGe. The thickness of the support member 166 may be in the range of about 30 μm to about 500 μm, but the embodiment is not limited thereto.

According to another embodiment, the support member 166 may include a conductive sheet or an insulating material.

The current blocking layer 168 is interposed between the second conductive type semiconductor layer 130 and the first conductive layer 161. The current blocking layer 168 may overlap with the electrode 170 perpendicularly to the electrode 150. The current blocking layer 168 may have an area at least wider than that of the electrode 150. The perpendicular direction may be a thickness direction of the light emitting structure layer 125.

The current blocking layer 168 may include at least one selected from the group consisting of $SiO_2$, $SiO_x$, $SiO_xN_y$, $Si_3N_4$, $Al_2O_3$, and $TiO_2$, but the embodiment is not limited thereto. The current blocking layer 168 may include a material forming schottky contact, but the embodiment is not limited thereto.

The protective layer 169 is provided at an outer peripheral portion of the light emitting structure layer 125, and may have a loop shape or a frame shape.

An inner side portion of the protective layer 169 is interposed between the second conductive type semiconductor layer 130 and the first conductive layer 161, and an outer side portion of the protective layer 169 extends outward from the lateral surface of the light emitting structure layer 125. A lower surface of the outer portion of the protective layer 169 may make contact with the top surface of the first conductive layer 161. The protective member 169 may include an insulating material or a conductive oxide material. For example, the protective layer 169 may be selected from the group consisting of ITO, IZO, IZON, IZTO, IAZO, IGZO, IGTO, AZO, ATO, GZO, $SiO_2$, $SiO_x$, $SiO_xN_y$, $Si_3N_4$, $Al_2O_3$, and $TiO_2$.

The protective layer 169 may space the light emitting structure layer 125 apart from another conductive layer. In addition, the protective member 169 can improve the adhesive strength with the second conductive type semiconductor layer 130.

An insulating layer 190 is provided at the lateral surface of the light emitting structure 125, and may extend from a top surface of the protective member 169 to the top surface of the light emitting structure layer 125.

Figure 20:
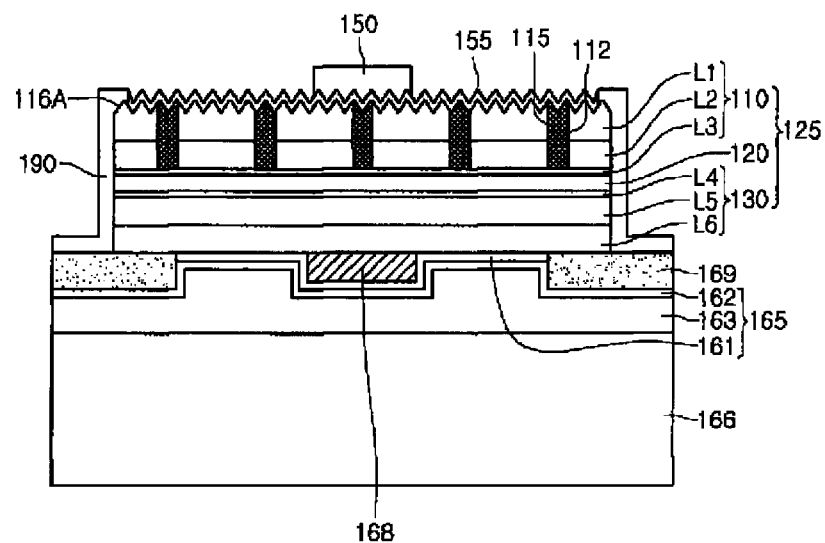
FIG. 20 is an exploded perspective view showing a display device according to a sixth embodiment.

FIG. 20 is a side sectional view showing a light emitting device according to a sixth embodiment.

Referring to FIG. 20, the light emitting device may include a fine light extraction structure 116A formed on the first conductive type semiconductor layer 110. The light extraction structure 116A has a pattern internal and a pattern size corresponding to a nano-size. The light extraction structure 116A may be formed through a wet etching process and/or a dry etching process, and the pattern interval and the pattern size of the light emitting structure 116A are not limited to the nano-size.

The transmissive electrode layer 155 may be formed on the first conductive type semiconductor layer 110, and may be formed on an area corresponding to at least 70% of the area of the top surface of the first conductive type semiconductor layer 110.

The first conductive type semiconductor layer 110 may further include the third semiconductor layer L3. The second conductive type semiconductor layer 130 may further include a fourth semiconductor layer L4.

The third semiconductor layer L3 may include a P type semiconductor layer interposed between the second semiconductor layer L2 and the active layer 120. The fourth semiconductor layer L4 may include an N type semiconductor layer interposed between the active layer 120 and the fifth semiconductor layer L5. The third semiconductor layer L3 may include a material having band gap higher than band gap of the active layer 120. The fourth semiconductor layer L4 may include a material having band gap higher than that of the active layer. At least one of the third and fourth semiconductor layers L3 and L4 may include a semiconductor layer having a compositional formula of $In_xAl_yGa_{1-x-y}N$ ($0 \leq x \leq 1$, $0 \leq y \leq 1$, $0 \leq x+y \leq 1$).

A void space may be formed in the hole 112 provided in the first conductive type semiconductor layer 110, and may be closer to the active layer 120 than to the top surface of the first conductive type semiconductor layer 110.

Figure 21:
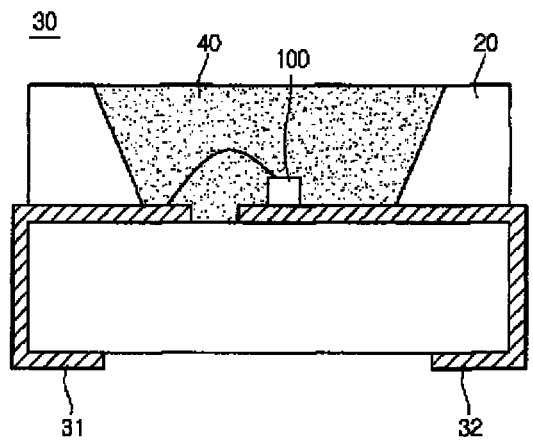
FIG. 21 is a side sectional view showing a light emitting device package according to the embodiment.

FIG. 21 is a sectional view showing a light emitting device package 30 according to the embodiment.

Referring to FIG. 21, the light emitting device package 30 includes a body 20, first and second lead electrodes 31 and 32 formed on the body 20, the light emitting device 100 according to the embodiment, which is installed in the body 20 and electrically connected to the first and second lead electrodes 31 and 32, and a molding member 40 surrounding the light emitting device 100.

The body 20 may include a conductive substrate including silicon, synthetic resin including polyphthalamide (PPA), a ceramic substrate, an insulating substrate, or a metallic substrate (e.g., MCPCB). An inclined surface may be formed around the light emitting device 100. The body 20 may include a through hole structure, but the embodiment is not limited thereto.

The first and second lead electrodes 31 and 32 are electrically insulated from each other and supply power to the light emitting device 100. The first and second lead electrodes 31 and 32 may reflect light emitted from the light emitting device 100 to increase light efficiency, and may discharge heat emitted from the light emitting device 100 to the outside.

The light emitting device 100 may be mounted on the body 20 or on the first and second lead electrodes 31 and 32.

The light emitting device 100 may be electrically connected with the first lead electrode 31 through a wire, and may be connected with the second lead electrode 32 through a die bonding scheme.

The molding member 40 may protect the light emitting device 100 while surrounding the light emitting device 100. In addition, the molding member 40 may include phosphors to change the wavelength of light emitted from the light emitting device 100. A lens may be provided on the molding member 40, and the lens may be realized in a contact structure or a non-contact structure with the molding member 40.

The light emitting device 100 may be electrically connected with the body 20 or a lower surface of a substrate via a through hole.

At least one of the above light emitting devices according to the embodiments may be mounted is the light emitting package, but the embodiment is not limited thereto.

Although the embodiment has been described in that the light emitting device package has a top view type, the light emitting device package may have a side view type. Accordingly, a heat sink characteristic, conductivity, and a reflectance characteristic can be improved. After such a top-view-type or side-view-type light emitting device is packaged in the resin layer, a lens may be formed on the resin layer or the lens may be bonded with the resin layer, but the embodiment is not limited thereto.

<Lighting System>

The light emitting device or the light emitting device package according to the embodiment can be applied to the light unit. The light unit has a structure in which a plurality of light emitting devices or a plurality of light emitting device packages are arrayed. The light unit may include a display device shown in FIGS. 22 and 23 and a lighting device shown in FIG. 24. In addition, the light unit may include an illumination lamp, a signal lamp, a headlight of a vehicle, and an electric sign board.

Figure 22:
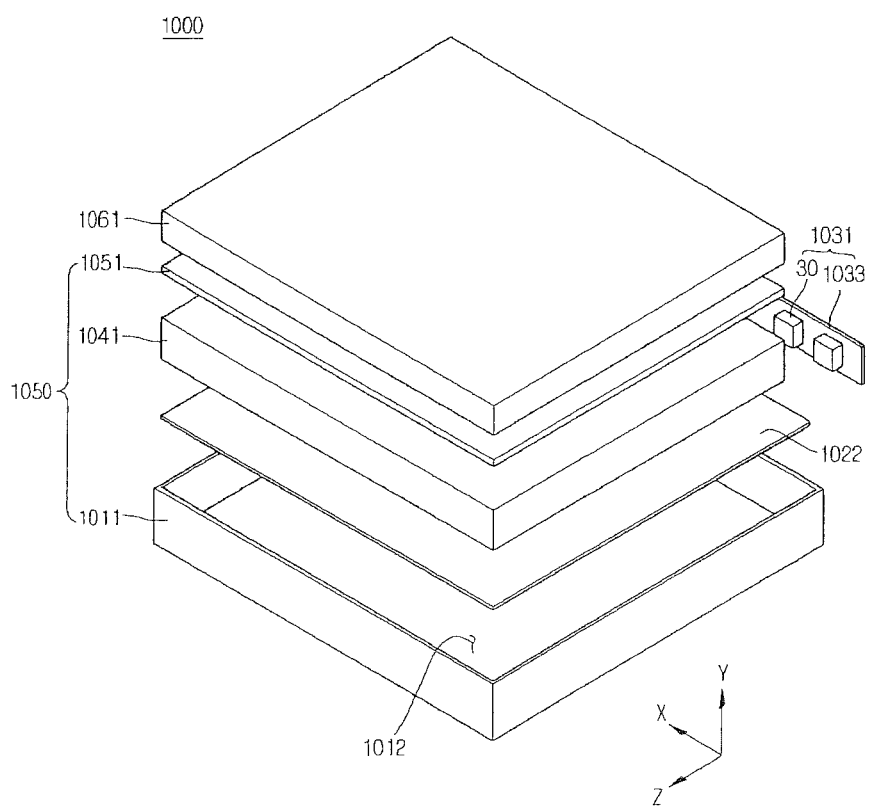
FIG. 22 is a view showing a display device according to the embodiment.

FIG. 22 is an exploded perspective view showing a display device 1000 according to the embodiment.

Referring to FIG. 22, the display device 1000 according to the embodiment includes a light guide plate 1041, a light emitting module 1031 for supply the light to the light guide plate 1041, a reflective member 1022 provided under the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as polymethyl methacrylate (PMMA), polyethylene terephthalate (PET), polycarbonate (PC), cyclic olefin copolymer (COC) and polyethylene naphthalate (PEN) resin.

The light emitting module 1031 supplies the light to at least one side of the light guide plate 1041 and serves as the light source of the display device.

At least one light emitting module 1031 is provided to directly or indirectly supply the light from the lateral side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval The substrate 1033 may include a printed circuit board (PCB) having a circuit pattern (not shown). In addition, the substrate 1033 may also include a metal core PCB (MCPCB) or a flexible PCB (FPCB) as well as a typical PCB, but the embodiment is not limited thereto. If the light emitting device packages 30 are installed on the lateral side of the bottom cover 1011 or on a heat dissipation plate, the substrate 1033 may be omitted. The heat dissipation plate partially makes contact with the top surface of the bottom cover 1011.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed under the light guide plate 1041. The reflective member 1022 reflects the light, which travels downward through the lower surface of the light guide plate 1041, toward the light guide plate 1041, thereby improving the brightness of the light unit 1050. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape having an open top surface, but the embodiment is not limited thereto. The bottom cover 1011 can be coupled with the top cover, but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including transparent first and second substrates, which are opposite to each other, and a liquid crystal layer interposed between the first and second substrates. A polarizing plate can be attached to at least one surface of the display panel 1061, but the embodiment is not limited thereto. The display panel 1061 displays information based on the light that has passed through the optical sheet 1051. The display device 1000 can be applied to various portable terminals, monitors or laptop computers, and televisions.

The optical sheet 1051 is disposed between the display panel 1061 and the light guide plate 1041 and includes at least one transmissive sheet. For instance, the optical sheet 1051 includes at least one of a diffusion sheet, a horizontal and vertical prism sheet, and a brightness enhancement sheet. The diffusion sheet diffuses the incident light, the horizontal and vertical prism sheet concentrates the incident light onto the display region, and the brightness enhancement sheet improves the brightness by reusing the lost light. In addition, a protective sheet can be provided on the display panel 1061, but the embodiment is not limited thereto.

The light guide plate 1041 and the optical sheet 1051 can be provided on the light path of the light emitting module 1031 as optical members, but the embodiment is not limited thereto.

Figure 23:
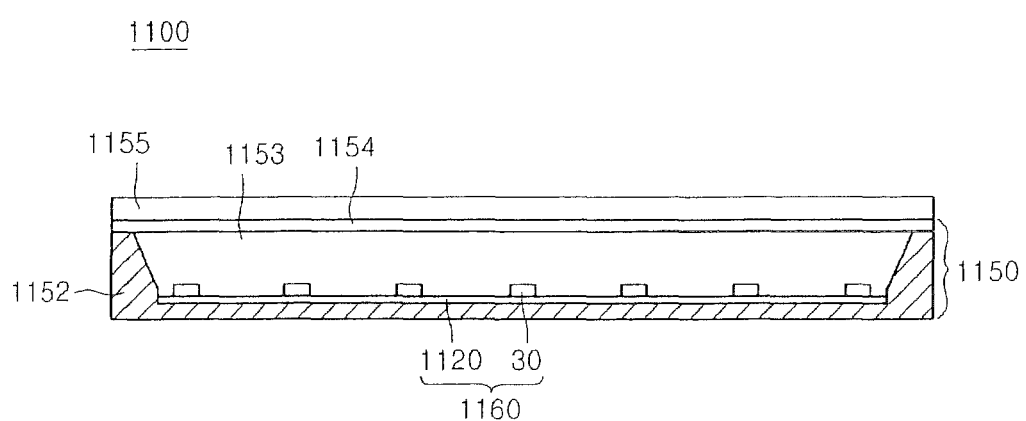
FIG. 23 is a view showing another example of the display device according to the embodiment.

FIG. 23 is a sectional view showing a display device according to the embodiment.

Referring to FIG. 23, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit.

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhancement sheet. The light guide plate may include PC or poly methyl methacrylate (PMMA). The light guide plate can be omitted. The diffusion sheet diffuses the incident light, the horizontal and vertical prism sheet concentrates the incident light onto the display region, and the brightness enhancement sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

Figure 24:
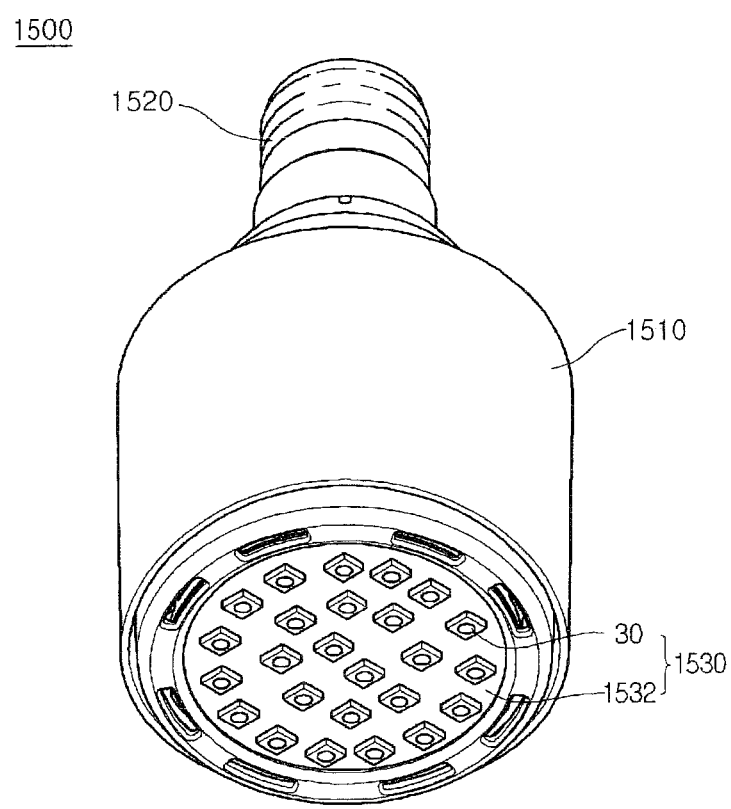
FIG. 24 is a view showing a lighting device according to the embodiment.

FIG. 24 is a perspective view showing a lighting device according to the embodiment.

Referring to FIG. 24, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 according to the embodiment installed on the substrate 1532. The light emitting device packages 30 are spaced apart from each other or arranged in the form of a matrix.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously arranged to provide various colors and brightness. For instance, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, the light emitting device packages including the light emitting device 100 are arranged on the substrate to form the light emitting module. In addition, the light emitting devices as shown in FIG. 1 are arranged on the substrate and then packaged to form the light emitting module.

A method of manufacturing a light emitting device according to the embodiment includes steps of forming a sacrificial layer on a substrate; forming a first conductive type semiconductor layer including P-type dopants on the sacrificial layer; forming an active layer on the first conductive type semiconductor layer; forming a second conductive type semiconductor layer on the active layer; and removing a second region from the sacrificial layer except for the first region. The step of removing the sacrificial layer includes steps of forming a plurality of holes through one of the first semiconductor conductive layer, the active layer, and the second conductive type semiconductor layer to expose the sacrificial layer; and etching the second region of the sacrificial layer through the hole.

According to the embodiment, since a laser lift off (LLO) process is not performed, defects resulting from epitaxial growth can be reduced. Accordingly, light extraction efficiency can be improved by using a photonic crystalline structure. In addition, the embodiment can reduce crystalline defects resulting from epitaxial growth and improve the light extraction efficiency by using the hybrid photonic crystalline structure. In addition, a reflective layer is provided under the light emitting structure layer, so that the light extraction efficiency can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
   a first conductive type semiconductor layer including a P-type dopant, the first conductive type semiconductor layer having a plurality of holes that penetrate the first conductive type semiconductor layer;
   a first electrode layer disposed on the first conductive type semiconductor layer;

an active layer under the first conductive type semiconductor layer;

a second conductive type semiconductor layer including an N-type dopant, the second conductive type semiconductor layer disposed under the active layer;

a second electrode layer disposed under the second conductive type semiconductor layer; and an insulating material disposed in the plurality of holes of the first conductive type semiconductor layer, wherein each of the plurality of holes has a depth equal to a thickness of the first conductive type semiconductor layer, and wherein the insulating material has a height equal to the thickness of the first conductive type semiconductor layer, wherein the insulating material contacts the active layer.

2. The semiconductor light emitting device of claim 1, wherein a pattern is formed on a top surface of the first conductive type semiconductor layer.

3. The semiconductor light emitting device of claim 1, wherein the first electrode layer includes a transparent electrode layer on the first conductive type semiconductor layer, and the second electrode layer includes at least one of a reflective electrode layer and a conductive support member under the second conductive type semiconductor layer.

4. The semiconductor light emitting device of claim 1, wherein the first electrode layer includes at least one of a reflective electrode layer and a conductive support member disposed on the first conductive type semiconductor layer, and the second electrode layer includes a transparent electrode layer disposed under the second conductive type semiconductor layer.

5. The semiconductor light emitting device of claim 1, wherein at least 40% of a top surface of the first conductive type semiconductor layer is exposed.

6. The semiconductor light emitting device of claim 1, wherein the first conductive type semiconductor layer includes a P-type nitride semiconductor doped with the P-type dopant, and the second conductive type semiconductor layer includes an N-type nitride layer doped with the N-type dopant.

7. The semiconductor light emitting device of claim 1, wherein at least one of the holes is disposed under a region of the first electrode layer.

8. The semiconductor light emitting device of claim 1, wherein the first conductive type semiconductor layer includes AlN or AlGaN.

9. The semiconductor light emitting device of claim 8, wherein the holes are disposed at an irregular interval or a regular interval on a whole region of the first conductive type semiconductor layer.

10. The semiconductor light emitting device of claim 8, wherein a portion of at least one of the holes includes an air gap.

11. The semiconductor light emitting device of claim 10, wherein the air gap is disposed to be closer to the active layer than a top surface of the first conductive type semiconductor layer.

12. The semiconductor light emitting device of claim 3, wherein the transparent electrode layer is provided in a concave-convex layer.

13. A semiconductor light emitting device comprising:

a first conductive type semiconductor layer including a P-type dopant, the first conductive type semiconductor layer having a plurality of holes that penetrate the first conductive type semiconductor layer;

a first electrode layer disposed on the first conductive type semiconductor layer;

an active layer under the first conductive type semiconductor layer;

a second conductive type semiconductor layer including an N-type dopant, the second conductive type semiconductor layer disposed under the active layer;

a second electrode layer disposed under the second conductive type semiconductor layer;

an insulating material disposed in the plurality of holes of the first conductive type semiconductor layer; and wherein each of the plurality of holes has a depth equal to a thickness of the first conductive type semiconductor layer, and wherein the insulating material has a height equal to the thickness of the first conductive type semiconductor layer, wherein the first conductive type semiconductor layer includes a second semiconductor layer and a third semiconductor layer that are alternately stacked.

* * * * *